US009620875B2

(12) United States Patent
Kim et al.

(10) Patent No.: US 9,620,875 B2
(45) Date of Patent: Apr. 11, 2017

(54) MEMORY CARD

(71) Applicant: Samsung Electronics Co., Ltd., Suwon-si, Gyeonggi-do (KR)

(72) Inventors: Yu-Sung Kim, Seoul (KR); Jin-Hyuk Lee, Suwon-si (KR); Il-Mok Kang, Suwon-si (KR); Seok-Jae Han, Seongnam-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 14/804,316

(22) Filed: Jul. 20, 2015

(65) Prior Publication Data

US 2016/0037661 A1 Feb. 4, 2016

(30) Foreign Application Priority Data

Aug. 1, 2014 (KR) ........................ 10-2014-0099242
Dec. 26, 2014 (KR) ........................ 10-2014-0191127

(51) Int. Cl.

| | |
|---|---|
| ***G06K 19/06*** | (2006.01) |
| ***H05K 1/14*** | (2006.01) |
| ***H01R 12/72*** | (2011.01) |
| ***H01R 13/64*** | (2006.01) |

(52) U.S. Cl.

CPC ........... *H01R 12/721* (2013.01); *H01R 13/64* (2013.01)

(58) Field of Classification Search

USPC ........................................... 235/492; 361/737
See application file for complete search history.

(56) References Cited

U.S. PATENT DOCUMENTS

| | | | | |
|---|---|---|---|---|
| 6,939,182 | B1 * | 9/2005 | Wen | G06K 13/06 439/55 |
| 7,048,559 | B2 | 5/2006 | Shobara et al. | |
| 7,291,903 | B2 | 11/2007 | Nishizawa et al. | |
| 7,307,848 | B2 | 12/2007 | Takiar | |
| 7,364,820 | B2 | 4/2008 | Tanaka et al. | |
| 2003/0156467 | A1 * | 8/2003 | Gilton | G11C 13/0011 365/200 |
| 2005/0215125 | A1 * | 9/2005 | Matsumoto | H05K 7/1455 439/680 |
| 2005/0279838 | A1 * | 12/2005 | Wang | G06K 19/077 235/492 |
| 2006/0172603 | A1 | 8/2006 | Matsumoto et al. | |

(Continued)

FOREIGN PATENT DOCUMENTS

| | | |
|---|---|---|
| JP | 200385488 A | 3/2003 |
| JP | 2004095418 | 3/2004 |

(Continued)

*Primary Examiner* — Daniel Hess
(74) *Attorney, Agent, or Firm* — Renaissance IP Law Group LLP

(57) ABSTRACT

A memory card, comprising: a top surface; a bottom surface on an opposite side of the memory card from the top surface; and a first alignment structure formed on the top surface or the bottom surface and configured to interface with a corresponding second alignment structure of a memory card socket when the memory card is correctly inserted into the memory card socket and configured to substantially prevent full insertion of the memory card when the memory card is incorrectly inserted into the memory card socket.

14 Claims, 11 Drawing Sheets

(56) References Cited

U.S. PATENT DOCUMENTS

| | | | | |
|---|---|---|---|---|
| 2007/0259567 | A1* | 11/2007 | Chen | G06K 19/077<br>439/638 |
| 2008/0235939 | A1* | 10/2008 | Hiew | H01L 21/561<br>29/831 |
| 2012/0315781 | A1 | 12/2012 | Little et al. | |

FOREIGN PATENT DOCUMENTS

| | | | |
|---|---|---|---|
| JP | 200556169 | A | 3/2005 |
| JP | 2005243489 | | 9/2005 |
| JP | 2009140662 | | 6/2009 |
| JP | 5027622 | | 6/2012 |
| JP | 5090510 | | 9/2012 |
| JP | 2012185958 | | 9/2012 |
| JP | 5125456 | | 11/2012 |

* cited by examiner

MEMORY CARD

CROSS-REFERENCE TO RELATED APPLICATION

This application claims the benefit of Korean Patent Application No. 10-2014-0099242, filed on Aug. 1, 2014, in the Korean Intellectual Property Office, the disclosure of which is incorporated herein in its entirety by reference.

BACKGROUND

Embodiments relate to a memory card having an alignment structure to reduce a chance that the memory card is inserted into a memory card socket in a reverse direction.

Memory cards are generally configured such that a flash memory is included inside a small-size package in a rectangular panel shape where multiple external connection terminals are arranged in parallel outside the small-size package. The memory card is mounted on an electronic device, such as a cellular phone, a digital camera, a laptop computer, or the like, through a memory card socket. If the memory card is inserted into the memory card socket in a correct direction, the memory card is inserted into a mounting position and may operate. However, if the memory card is inserted into the memory card socket in a reverse direction, the memory card may not operate. In this case, the non-operation of the memory card may cause a failure in the electronic device.

SUMMARY

An embodiment includes a memory card, comprising: a top surface; a bottom surface on an opposite side of the memory card from the top surface; and a first alignment structure formed on the top surface or the bottom surface and configured to interface with a corresponding second alignment structure of a memory card socket when the memory card is correctly inserted into the memory card socket and configured to substantially prevent full insertion of the memory card when the memory card is incorrectly inserted into the memory card socket.

An embodiment includes a system, comprising: a memory card comprising: a top surface; a bottom surface on an opposite side of the memory card from the top surface; and a first alignment structure formed on the top surface or the bottom surface; and a memory card socket comprising a second alignment structure configured to interface with the first alignment structure when the memory card is correctly inserted into the memory card socket and configured to substantially prevent full insertion of the memory card when the memory card is incorrectly inserted into the memory card socket.

An embodiment includes an electronic device comprising: a controller; and a memory coupled to the controller and configured to store data; wherein the memory comprises: a memory card having a first alignment structure formed on a top surface or a bottom surface of the memory card; and a memory card socket having a second alignment structure configured to interface with the first alignment structure of the memory card when the memory card is inserted in the memory card socket.

BRIEF DESCRIPTION OF THE DRAWINGS

Embodiments will be more clearly understood from the following detailed description taken in conjunction with the accompanying drawings in which.

DETAILED DESCRIPTION OF THE EMBODIMENTS

Figure 1A:
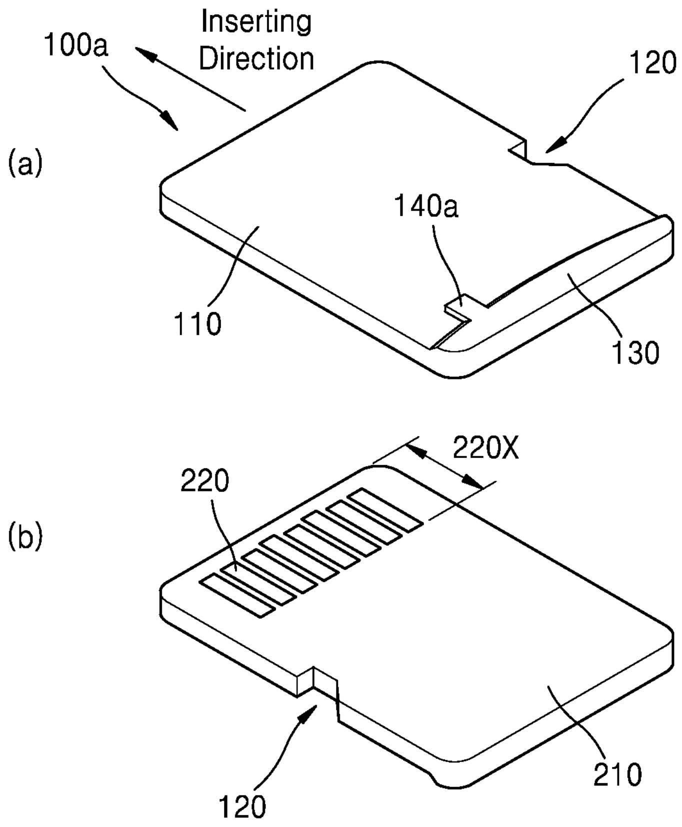
FIGS. 1A through 1I are perspective views illustrating a memory card according to various embodiments.

Hereinafter, embodiments will be described in detail with reference to the accompanying drawings. Throughout the drawings, like reference numerals refer to like elements, and a description thereof will not be repetitively made.

The embodiments are provided to more fully describe the concepts to those of ordinary skill in the art, and other embodiments may take various different forms and the scope of embodiments are not limited to the particular embodiments described herein. Rather, these embodiments are provided so that this disclosure will be thorough and complete, and will fully convey the scope to those of ordinary skill in the art.

Herein, although terms such as "first," "second", or the like may be used to describe various members, regions, layers and/or elements, these members, regions, layers and/or elements should not be limited by these terms. These terms do not mean a particular order, top and bottom, or superiority or inferiority, and are only used to distinguish one member, region, layer and/or element from another member, region, layer and/or element. Thus, a first member, region, layer and/or element discussed below could be termed a second member, region, layer and/or element, and similarly, a second member, region, layer and/or element may be termed a first member, region, layer and/or element.

Unless defined otherwise, all terms (including technical and scientific terms) used herein are to be interpreted as understood by those having ordinary skill in the art. Further, terms defined in general dictionaries should not be interpreted ideally or excessively, unless defined otherwise.

When a certain embodiment may be implemented differently, a particular processing order may be different from that described below. For example, two processes described successively may be performed substantially at the same time or may be performed in a reverse order to that described.

In the accompanying drawings, for example, modifications of the shown shape may be expected according to a manufacturing technique and/or tolerance. Thus, embodiments of the inventive concept should not be construed as being limited to a particular shape of a region illustrated herein, and should include, for example, a shape change caused during a manufacturing process.

As used herein, the term "and/or" includes any and all combinations of one or more of the associated listed items. Expressions such as "at least one of," when preceding a list of elements, may indicate the entire list of elements, an individual element of the list, or groups of the individual elements.

Hereinafter, embodiments will be described in detail with reference to the drawings.

FIGS. 1A through 1H are perspective views illustrating a memory card according to various embodiments. FIG. 1A illustrates a memory card 100*a* having a first alignment structure 140*a* on a top surface 110 of the memory card 100*a*.

The memory card 100*a* may include a circuit board, a semiconductor chip, and a mold member. The semiconductor chip may include a memory chip and a controller chip that may be positioned to be stacked on each other. Multiple memory chips may be arranged to be stacked on one another, and the controller chip may be positioned on top of the uppermost memory chip among the memory chips. However, a single memory chip may be provided. The memory chip may be positioned spaced apart from the controller chip. The controller chip may have a smaller size than the memory chip. The operating principles of the controller chip and the memory chip will be described later with reference to FIG. 3.

FIG. 1A is a perspective view illustrating a memory card 100*a*. View (a) illustrates the top surface 110 of the memory card 100*a*. When viewed from the top surface 110, the memory card 100*a* approximately forms a thin rectangular parallelepiped. A label may be provided on the top surface 110. The label may be a sticker or printed ink. A stopper groove 120 may be formed on a side surface of the memory card 100*a*. The stopper groove 120 may be positioned on a left side surface or a right side surface of the memory card 100*a*. A memory card socket (300*a* of FIG. 2A) may include a stopper protrusion 325 on a left side surface or a right side surface thereof, which is inserted into or withdrawn from the stopper groove 120. If the memory card 100*a* is inserted into the memory card socket 300*a* (see FIG. 2A) in a correct direction, the stopper groove 120 is stopped by the stopper protrusion 325, such that the memory card 100*a* is fixedly mounted. The stopper protrusion 325 may protrude in a triangular shape when viewed from top; however, in other embodiments, the stopper protrusion 325 may have other shapes. For firm engagement between the stopper groove 120 and the stopper protrusion 325, a part of the stopper groove 120 near a front end portion of the memory card 100*a* may have a steep gradient. To facilitate insertion and withdrawal of the memory card 100*a*, the part of the stopper groove 120 near a rear end portion of the memory card 100*a* may have a more gentle gradient.

A grip portion 130 may be disposed in the rear end portion of the memory card 100*a*. A size of the memory card 100*a* may be relatively small. Thus, if the memory card 100*a* is formed to be in a flat shape without having a protruding portion, it may be very difficult for a user to insert or withdraw the memory card 100*a* into or from the memory card socket 300*a* (see FIG. 2A) by hand. For this reason, the memory card 100*a* may have, on the rear end portion thereof, the grip portion 130 that is a protruding portion in a grip shape to facilitate holding of the memory card 100*a*. However, in some embodiments, the memory card 100*a* may not have a grip portion 130.

The grip portion 130 may be formed to extend from the left side surface to the right side surface of the memory card 100*a*. The grip portion 130 may be formed to protrude in a round shape in a direction toward the front end portion of the memory card 100*a*. On the other hand, the grip portion 130 may be formed approximately in a rectangular shape when viewed from top. Under the grip portion 130, relatively thick elements among elements formed on a circuit board may be positioned.

Although the grip portion 130 has been illustrated as extending a particular distance from an edge of the memory card 100*a*, the grip portions 130 may extend further towards the opposite edge.

External dimensions of the memory card 100*a* according to an embodiment may be about 11 mm×15 mm×1 mm, which may be the same as the standards of micro Secure Digital (SD) cards. That is, as the memory card 100*a* according to an embodiment may be formed to have a shape similar to a standardized product, the micro SD card, an electronic device capable of using both the micro SD card and the memory card 100*a* according to an embodiment may be implemented with some modifications of the memory card socket 300*a* (see FIG. 2A). In this way, by realizing an environment allowing the use of a micro SD card for a new electronic device, a user may be provided with increased convenience. However, embodiments are not limited to these particular external dimensions.

A first alignment structure 140*a* may be formed on the top surface 110 of the memory card 100*a*. The first alignment structure 140*a* may be formed in such a way to contact or be spaced apart from the grip portion 130. If the first alignment structure 140*a* contacts the grip portion 130, the grip portion 130 may be in shape having a protruding portion that forms the first alignment structure 140*a*.

The first alignment structure 140*a* may be formed in various shapes, such as not only a square shape, but also a triangular shape, a circular shape, a semi-circular shape, an irregular shape, and so forth.

One or more first alignment structures 140*a* may be formed on the top surface 110 of the memory card 100*a*. In FIG. 1A, one first alignment structure 140*a* is formed on the top surface 110 of the memory card 100*a*. In some embodiments, the first alignment structure 140*a* may not be formed on a side surface of the memory card 100*a* where the stopper groove 120 is formed; however, in other embodiments, the first alignment structure 140*a* may be formed on that side surface.

To prevent reverse-direction insertion, a micro SD card may be formed such that a front end portion thereof is formed to be narrower than a rear end portion thereof. As a result, the overall area of the micro SD card may be reduced, the size of a flash memory chip disposed inside the micro SD card may be reduced and thus a memory storage capacity may be reduced.

In contrast, in some embodiments, by forming the first alignment structure 140*a* on the top surface 110 of the memory card 100*a* to prevent insertion with an incorrect orientation, the front end portion of a memory card 100*a* need not be narrower. As a result, the internal region of the memory card 100*a* may be utilized more efficiently. Moreover, a space on which external connection terminals 220 are to be disposed is relatively larger and a spacing interval between the external connection terminals 220 may be relatively larger. As a result, when a contact electrically connected with the external connection terminal 220 is formed inside the memory card socket 300*a* (see FIG. 2A), a contact-terminal interval may be relatively larger, reducing or preventing a chance of a short circuit.

View (b) of FIG. 1A is a perspective view illustrating a bottom surface 210 of the memory card 100*a*. Multiple external connection terminals 220 may be formed on a part of the bottom surface 210 of the memory card 100*a* near the front end portion of the memory card 100*a*, which is first inserted along an insertion direction of the memory card 100*a*. One or more external connection terminals 220 may have a rectangular shape. The external connection terminals

220 may have the same shape or different shapes. The external connection terminal 220 may also be formed to have a shape optimized for electric connection with a contact of the memory card socket 300*a* (see FIG. 2A).

The external connection terminal 220 may be positioned spaced apart from the front end portion by a predetermined distance along the insertion direction of the memory card 100*a*. The predetermined distance may be longer than the length of the external connection terminal 220. The external connection terminal 220 may be disposed to be aligned with each other. Optionally, some external connection terminals 220 may be formed to have longer lengths than the other external connection terminals 220. Also in this case, among ends of the external connection terminals 220, ends near the rear end portion of the memory card 100*a* along the insertion direction may be formed to be aligned with each other. For example, the external connection terminals 220 having longer lengths may be power source connection terminals.

The memory card 100*a* may include a mold member formed of an insulating material, for example, an insulating synthetic resin material or the like. This material may extend around the memory card 100*a* except for the external connection terminals 220. The external connection terminals 220 may be formed of conductive metal, for example, copper, aluminum, or the like.

To protect the external connection terminals 220, the external connection terminals 220 and the bottom surface 210 of the memory card 100*a* may have a predetermined step therebetween. That is, the insulating material portion of the memory card 100*a* may be formed to be elevated with respect to the external connection terminals 200.

Figure 1B:
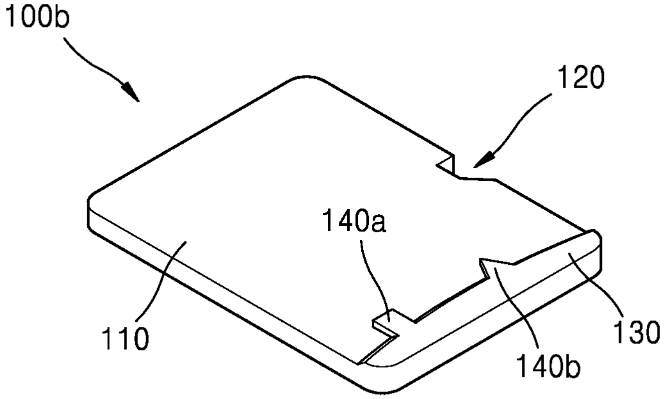

FIG. 1B is a perspective view illustrating a memory card 100*b* having two first alignment structures 140*a* and 140*b* on the top surface 110 of a memory card 100*b*. Although two first alignment structures 140*a* and 140*b* have been illustrated, any number of first alignment structures 140 may be present. The first alignment structures 140*a* and 140*b* may be formed to have different shapes; however, the first alignment structures 140*a* and 140*b* may have substantially the same shape. For example, as illustrated in FIG. 1B, one of the first alignment structures 140*a* and 140*b*, for example, the first alignment structure 140*a* may have a square shape and the other 140*b* may have a triangular shape. Also, one of the first alignment structures 140*a* and 140*b* may be formed to contact the grip portion 130 and the other may be formed to be spaced apart from the grip portion 130. Both of the first alignment structures 140*a* and 140*b* may be formed to contact or both may be formed to be spaced apart from the grip portion 130.

Figure 1C:
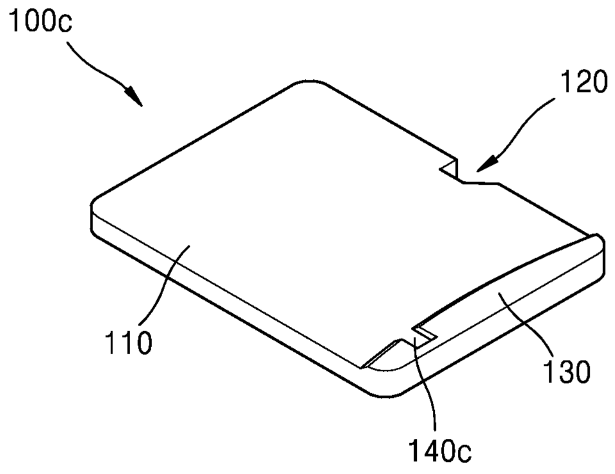

FIG. 1C illustrates a memory card 100*c* having an engraved first alignment structure 140*c* in the top surface 110 of the memory card 100*c*. As described previously, the first alignment structure 140*c* may be formed as a part of the grip portion 130. The first alignment structure 140*c* may be formed to have an engraved shape as illustrated in FIG. 1C. Similar to an embossed first alignment structure 140, there is no limitation in the shape of the engraved first alignment structure 140*c*.

As will be described again in FIG. 2C, the first alignment structure 140*c* of the memory card 100*c* and a second alignment structure 340*c* of a memory card socket 300*c* (see FIG. 2) have complementary shapes, so as to be removably coupled to each other. That is, to prevent reverse-direction insertion, a part of the memory card 100*c* may be inserted into the memory card socket 300*c* (see FIG. 2C) and a part of the memory card socket 300*c* (see FIG. 2C) may also be inserted into the memory card 100*c*.

Figure 1D:
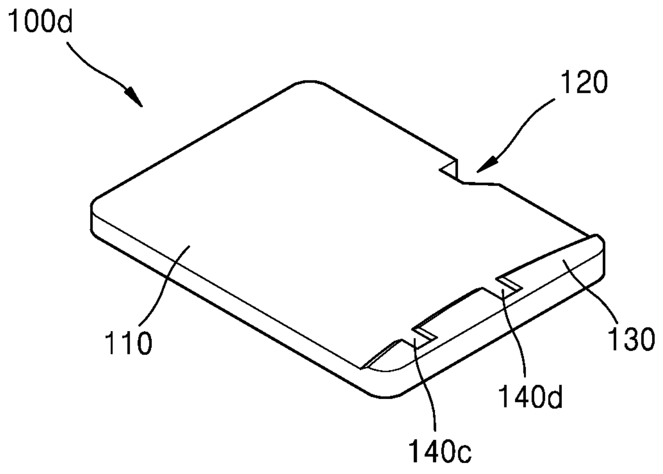

FIG. 1D illustrates a memory card 100*d* having two engraved first alignment structures 140*c* and 140*d* on the top surface 110 of the memory card 100*d*. The first alignment structures 140*c* and 140*d* may be formed as a part of the grip portion 130. There is no limitation in the number of first alignment structures 140*c* and 140*d*. Accordingly, multiple first alignment structures 140*c* and 140*d* may be formed in the grip portion 130 having engraved shapes. In some embodiments, the engraved shapes of the first alignment structures 140*c* and 140*d* may be different from each other while in others, the shapes are substantially the same.

Figure 1E:
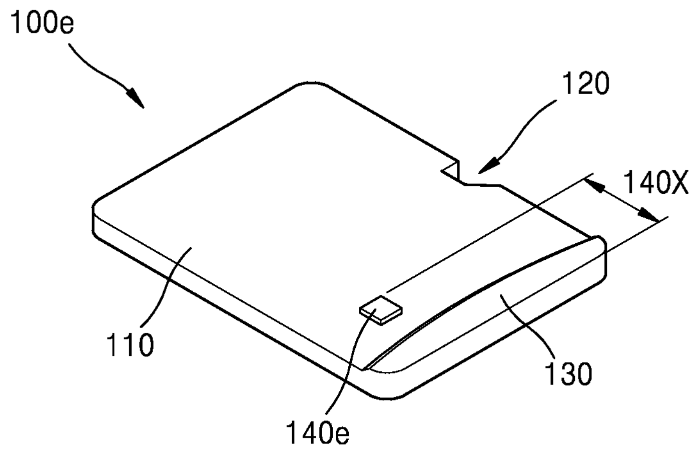

FIG. 1E illustrates a memory card 100*e* having a first alignment structure 140*e* formed to be spaced apart from the grip portion 130 on the top surface 110 of the memory card 100*e*. The first alignment structure 140*e* formed in the memory card 100*e* may contact the grip portion 130 to form a single shape, but may also be spaced apart from the grip portion 130 as illustrated in FIG. 1E.

Even when the first alignment structure 140*e* is formed to be spaced apart from the grip portion 130 in the memory card 100*e*, a second alignment structure 340*a* of the memory card socket 300*a* (see FIG. 2A) having a shape that is complementary to that of the first alignment structure 140*e* may be formed along a memory card insertion direction from a memory card insertion hole 330 (see FIG. 2A) to a position capable of receiving the first alignment structure 140*e*. The first alignment structure 140*e* may be disposed on the memory card 100*e* to be spaced apart from the grip portion 130 by any distance. However, to reduce or prevent a chance that the external connection terminals 220 (see FIG. 1A) are damaged by a protruding part inside the memory card socket 300*a* (see FIG. 2A) when the memory card 100*e* is inserted in a reverse direction, a length 140X from the rear end portion of the memory card 100*e* to the first alignment structure 140*e* in parallel with the memory card insertion direction may be longer than a length 220X (see FIG. 1A) from the front end portion of the memory card 100*e* to the further end of the external connection terminals 220 (see FIG. 1A).

Figure 1F:
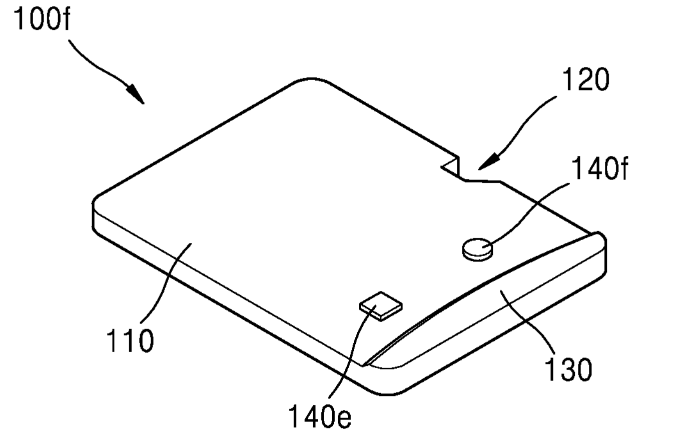

FIG. 1F illustrates a memory card 100*f* having two first alignment structures 140*e* and 140*f* formed to be spaced apart from the grip portion 130 on the top surface 110 of the memory card 100*f*. Although only two are illustrate, more than two first alignment structures 140*e* and 140*f* may be formed on the memory card 100*f*. The first alignment structures 140*e* and 140*f* may have substantially the same shape or different shapes. For example, as illustrated in FIG. 1F, one of the first alignment structures 140*e* and 140*f* may have a square shape and the other may have a circular shape. Also, one of the first alignment structures 140*e* and 140*f* may be formed to contact the grip portion 130 and the other may be spaced apart from the grip portion 130. Both of the first alignment structures 140*e* and 140*f* may be formed to contact the grip portion 130 or both may be formed to be spaced apart from the grip portion 130. The spacing distance and the size may differ between the first alignment structures 140*e* and 140*f*.

Figure 1G:
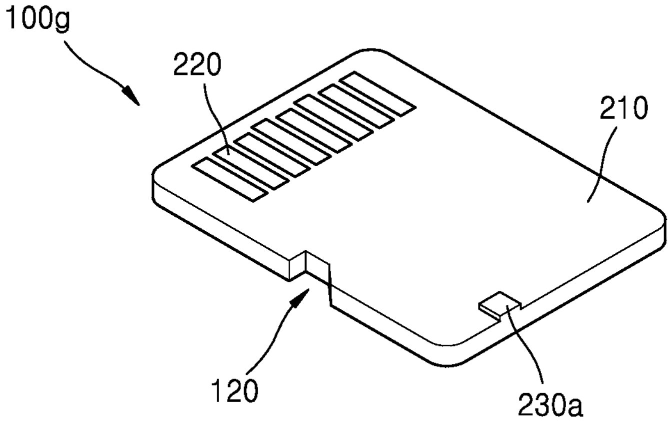

FIG. 1G is a perspective view illustrating a memory card 100*g* having a first alignment structure 230*a* on the bottom surface 210 of the memory card 100*g*. The first alignment structure 230*a* may be formed on the bottom surface 210. That is, the first alignment structure 230*a* may be formed on the top surface and/or the bottom surface 210 of the memory card 100*g*. The first alignment structure 230*a* may have features similar to any of the embossed first alignment structures described above.

In addition, in this embodiment, the memory card 100*g* does not include a grip portion 130. However, in other embodiments, a grip portion 130 may be present on the bottom surface 210, on another surface of the memory card 100*g*, or both.

Figure 1H:
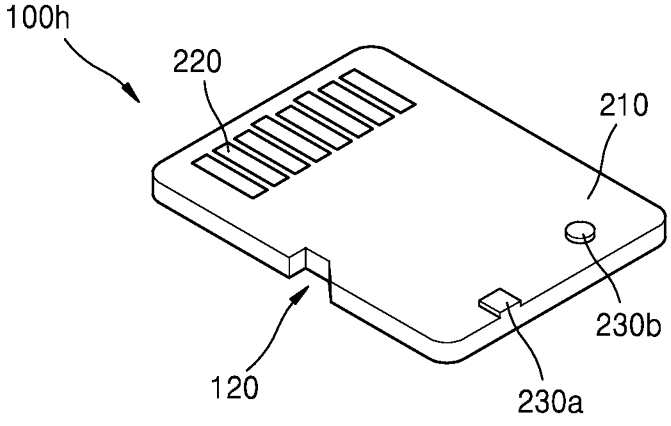

FIG. 1H is a perspective view illustrating a memory card 100*h* having two first alignment structures 230*a* and 230*b* on the bottom surface 210 of the memory card 100*h*.

Two or more first alignment structures 230*a* and 230*b* may be formed on the bottom surface 210. The first alignment structures 230*a* and 230*b* may be formed to have different shapes. For example, as illustrated in FIG. 1H, one of the first alignment structures 230*a* and 230*b* may have a square shape and the other may have a circular shape. The first alignment structures 230*a* and 230*b* may be formed to contact or to be spaced apart from a rear end portion of the memory card 100*h*. For example, as illustrated in FIG. 1H, the first alignment structure 230*a* may be formed to contact the rear end portion of the memory card 100*h* and the other first alignment structure 230*b* may be formed to be spaced apart from the rear end portion of the memory card 100*h*. The first alignment structures 230*a* and 230*b* may also have substantially the same shape. Both may be formed to contact or both may be formed to be spaced apart from the rear end portion of the memory card 100*h*.

Figure 1I:
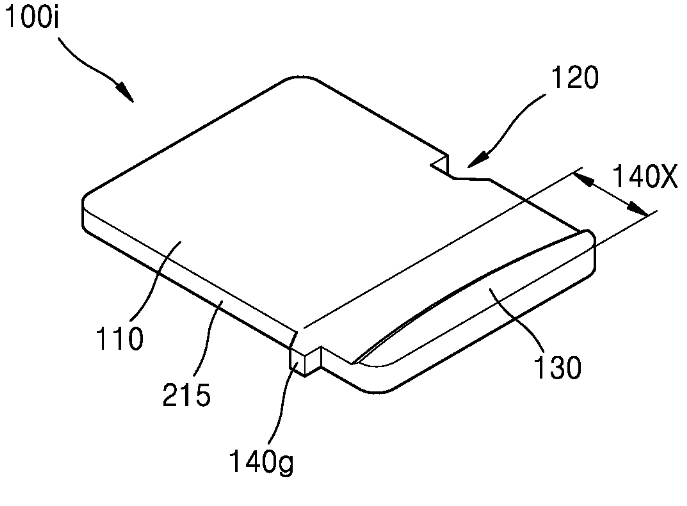

FIG. 1I illustrates a memory card 100*i* having a first alignment structure 140*g*. In this embodiment, the first alignment structure 140*g* may be disposed on a side surface 215 of the memory card 100*i*. Although a first alignment structure 140*g* is illustrated as having a particular shape, in other embodiments, the first alignment structure 140*g* may have different shapes. In this embodiment, the first alignment structure 140*g* is an embossed alignment structure extending outward from the side surface 215.

Although various examples of positions of first alignment structures have been described above, in some embodiments, the usage of such alignment structures may be combined in a single memory card. For example, a first alignment structure 230*a* on a bottom surface 210 may be combined with a first alignment structure 140*a* on a top surface 110. Any combination is possible such that when an attempt is made to insert the memory card in an incorrect orientation, at least one of the first alignment structures does not align with a corresponding second alignment structure of a memory card socket.

FIGS. 2A through 2D are plane views illustrating a memory card and a memory card socket according to various embodiments.

Figure 2A:
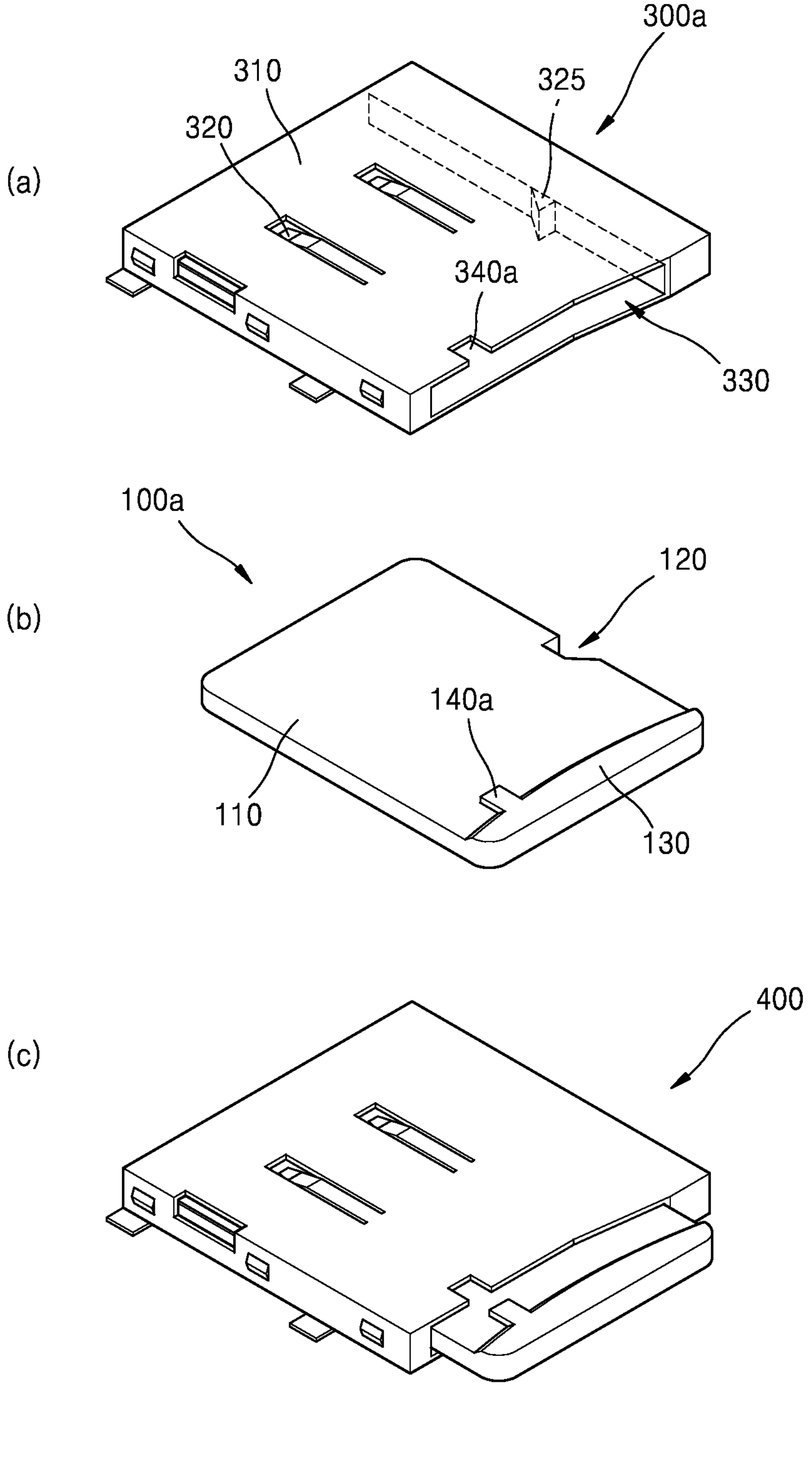
FIGS. 2A through 2D are perspective views illustrating a memory card and a memory card socket according to various embodiments.

FIG. 2A illustrates the memory card 100*a*, the memory card socket 300*a*, and a state 400 in which the memory card 100*a* is inserted into the memory card socket 300*a*. View (a) of FIG. 2A shows the memory card socket 300*a* having the second alignment structure 340*a* near the memory card insertion hole 330. The memory card 100*a* may be removably inserted into the memory card socket 300*a*. The memory card socket 300*a* may include a leaf spring 320 on a top surface 310. The leaf spring 320 may prevent the memory card 100 from be shaken due to a gap when the memory card 100*a* is inserted into the memory card socket 300*a* for use. In addition the leaf spring 320 may allow the external connection terminals 220 (see FIG. 1A) of the memory card 100*a* to be electrically connected with a contact inside the memory card socket 300*a*. There may be one or more leaf springs 320. The memory card socket 300*a* may include a stopper protrusion 325. The stopper protrusion may be configured to interface with the stopper groove 120.

One or more second alignment structures 340*a* may be formed near the memory card insertion hole 330. The second alignment structure 340*a* may be formed to have a shape that is complementary to that of the first alignment structure 140*a* of the memory card 100*a*, and the first alignment structure 140*a* of the memory card 100*a* may be removably coupled to the second alignment structure 340*a*. In order for the first alignment structure 140*a* to be more reliably inserted into the second alignment structure 340*a*, the size of the second alignment structure 340*a* may be equal to or larger than that of the first alignment structure 140*a*.

View (b) of FIG. 2A is a perspective view illustrating the top surface 110 of the memory card 100*a*. A description of FIG. 2A may be substantially the same as in (a) of FIG. 1A and thus will be omitted.

View (c) of FIG. 2A illustrates a state 400 where the memory card 100*a* is inserted into the memory card socket 300*a*. Since the external connection terminals 220 (see FIG. 1A) of the memory card 100*a* should be electrically connected with a contact inside the memory card socket 300*a*, the memory card 100*a* should be inserted in a correct direction. If the memory card 100*a* is inserted in a reverse direction, the memory card 100*a* does not operate, potentially causing a failure in an electronic device 1300 (see FIG. 5). As the memory card may have a generally thin rectangular parallelepiped shape and thus may be inserted into the memory card socket 300*a* in an upside-down reverse direction, the chance of such an occurrence is reduced if not eliminated.

In an embodiment, to prevent reverse-direction insertion of the memory card 100*a*, the first alignment structure 140*a* is formed in the memory card 100*a* and the second alignment structure 340*a* having a shape complementary to that of the first alignment structure 140*a* is formed in the memory card socket 300*a*. If the memory card 100*a* is inserted in the reverse direction, the first alignment structure 140*a* of the memory card 100*a* is substantially if not completely stopped by the memory card insertion hole 330 and thus cannot be inserted, thereby preventing reverse-direction insertion of the memory card 100*a*.

As will be described in further detail herein by example, in various embodiments, the memory card 100*a* may be formed with a variety of alignment structures and the memory card socket 300*a* may be formed in a complementary manner such that when the memory card 100*a* is inserted into the memory card socket 300*a* in a correct orientation, the memory card 100*a* will interface with the memory card socket 300*a* and operate normally. However, an attempt is made to insert the memory card 100*a* into the memory card socket 300*a* in an incorrect orientation, the first alignment structure 140*a* and the second alignment structure 340*a* are disposed such that the structures will not interface and one or more of the first alignment structure 140*a* and the second alignment structure 340 will contact a portion of the memory card socket 300*a* or the memory card 100*a*, respectively, such that further insertion of the memory card 100*a* is substantially prevented, or a force substantially greater than a typical insertion force is needed. As a result, a chance of full insertion of the memory card 100*a* into the memory card socket 300*a* in an incorrect orientation may be reduced or eliminated.

Figure 2B:
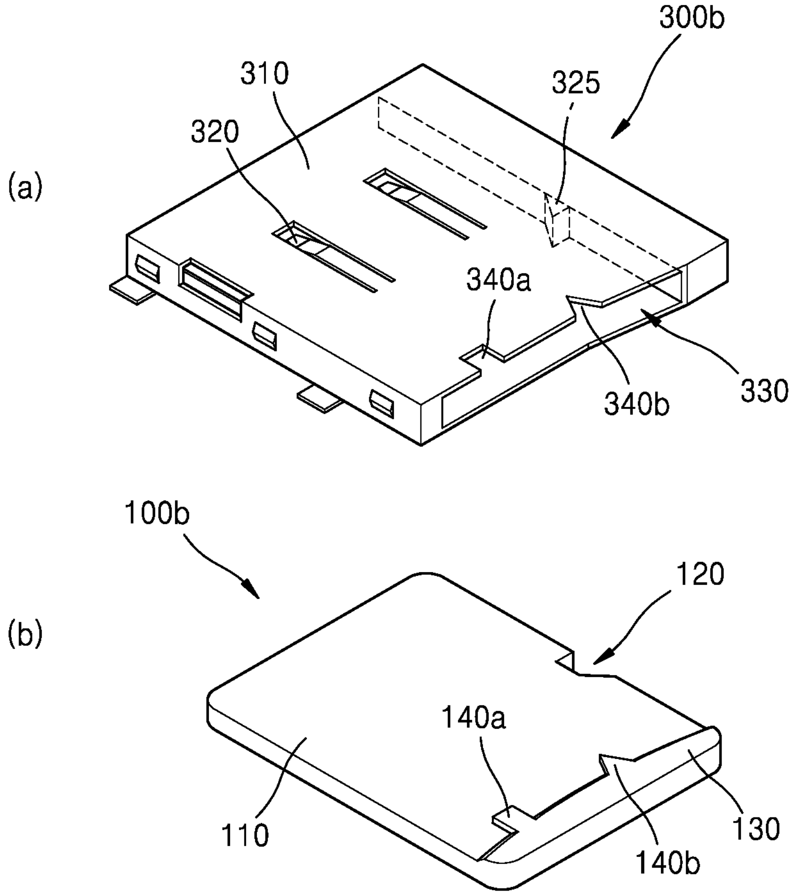

FIG. 2B illustrates the memory card 100*b* having multiple first alignment structures and the memory card socket 300*b* having multiple second alignment structures. View (a) of FIG. 2B illustrates the memory card socket 300*b* having two second alignment structures 340*a* and 340*b* near the memory card insertion hole 330.

Since the second alignment structures 340*a* and 340*b* may be formed in the memory card socket 300*b* to have shapes complementary to those of the first alignment structures 140*a* and 140*b* formed in the memory card 100*b*, the same number of second alignment structures 340*a* and 340*b* as that of the first alignment structures 140*a* and 140*b* may be formed in positions corresponding to the first alignment structures 140*a* and 140*b* in the memory card socket 300*b*. Of the second alignment structures 340*a* and 340*b*, for example, the second alignment structure 340*a* may correspond to the first alignment structure 140*a*, and the other second alignment structure 340*b* may correspond to the other first alignment structure 140*b*. The second alignment structures 340*a* and 340*b* may have substantially similar shapes or different shapes corresponding to the similarity or difference between shapes of the first alignment structures 140*a* and 140*b*.

Figure 2C:
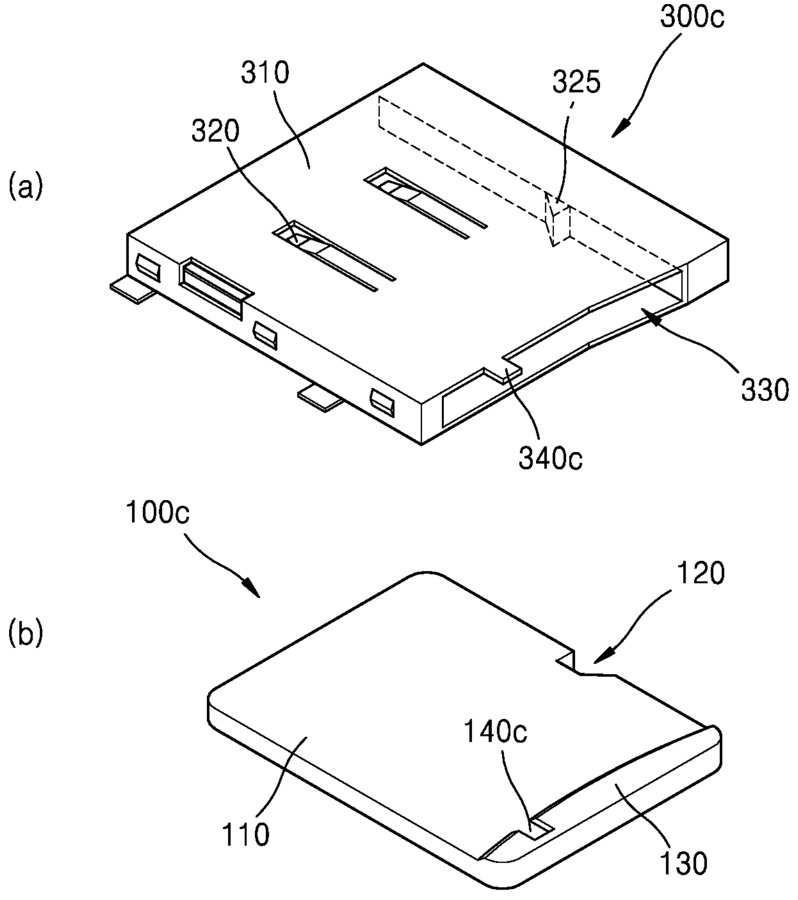

FIG. 2C illustrates the memory card 100*c* having a first alignment structure in an engraved shape and the memory card socket 300*c* having a second alignment structure in an embossed shape. As illustrated in (a) of FIG. 2C, the memory card socket 300*c* may include a second alignment structure 340*c* having an embossed shape. Although a particular shape of the second alignment structure 340*c* is illustrated, the second alignment structure 340*c* may have other embossed shapes. The second alignment structure 340*c* having the embossed shape and the first alignment structure 140*c* of the memory card 100*c* having the engraved shape may have complementary shapes. As a result, they may be removably coupled to each other. To reduce or prevent a chance of reverse-direction insertion, a part of the memory card 100*c* may be inserted into the memory card socket 300*c* and a part of the memory card socket 300*c* may also be inserted into the memory card 100*c*.

Figure 2D:
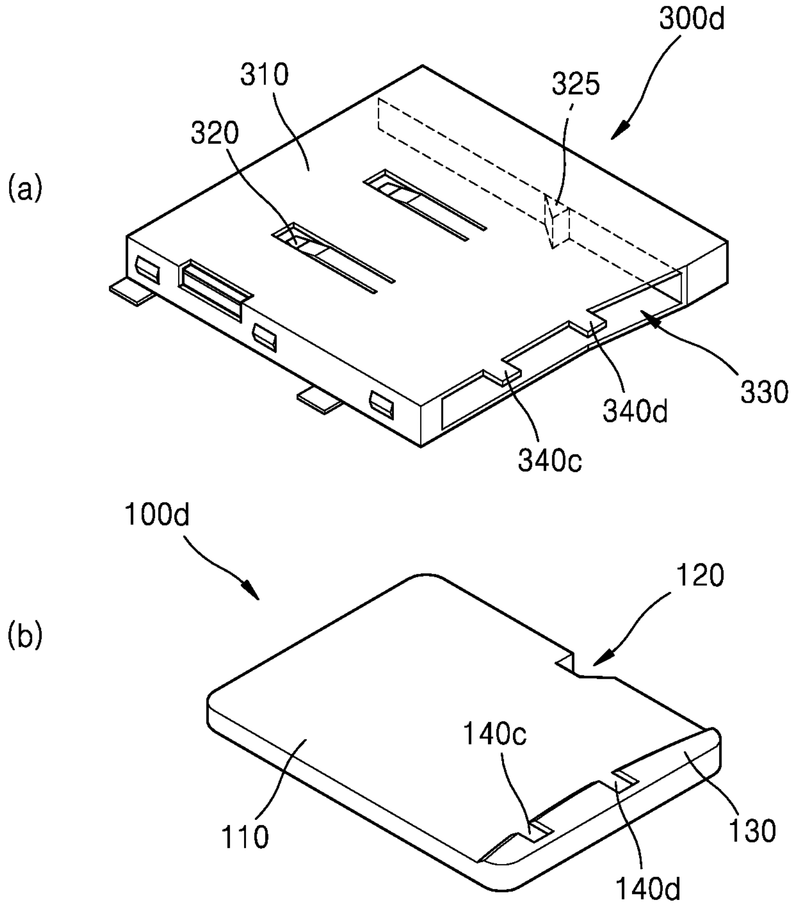

FIG. 2D illustrates the memory card 100*d* having multiple alignment structures in an engraved shape and a memory card socket 300*d* having multiple second alignment structures in an embossed shape.

The second alignment structures 340*c* and 340*d* may be formed near the memory card insertion hole 330. There is no limitation in the number of second alignment structures 340*c* and 340*d*. Accordingly, any number of second alignment structures 340*c* and 340*d* may be formed in an embossed shape near the memory card insertion hole 330. In this case, the embossed shapes of the second alignment structures 340*c* and 340*d* may be different from each other.

Figure 3:
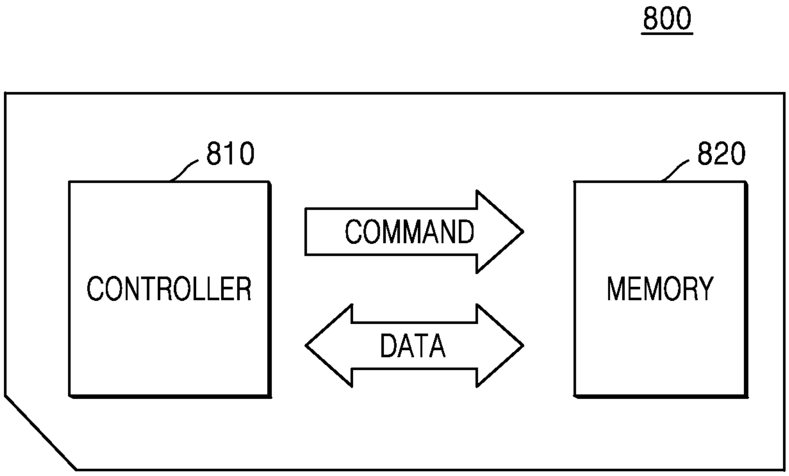
FIG. 3 is a schematic view illustrating operating principles of a memory card according to an embodiment.

FIG. 3 is a schematic view illustrating operating principles of a memory card according to an embodiment. More specifically, in a memory card 800, a controller 810 and a memory 820 are disposed to exchange electric signals. For example, if the controller 810 issues a command, the memory 820 may transmit data. The memory 820 or the controller 810 may include a semiconductor device. The memory card 800 may be of various types, for example, a memory stick card, a smart media card, a secure digital (SD) card, a mini SD card, a micro SD card, a multimedia card, and the like. The memory card 800 may have a form such as the memory cards described herein with one or more alignment structures.

Figure 4:
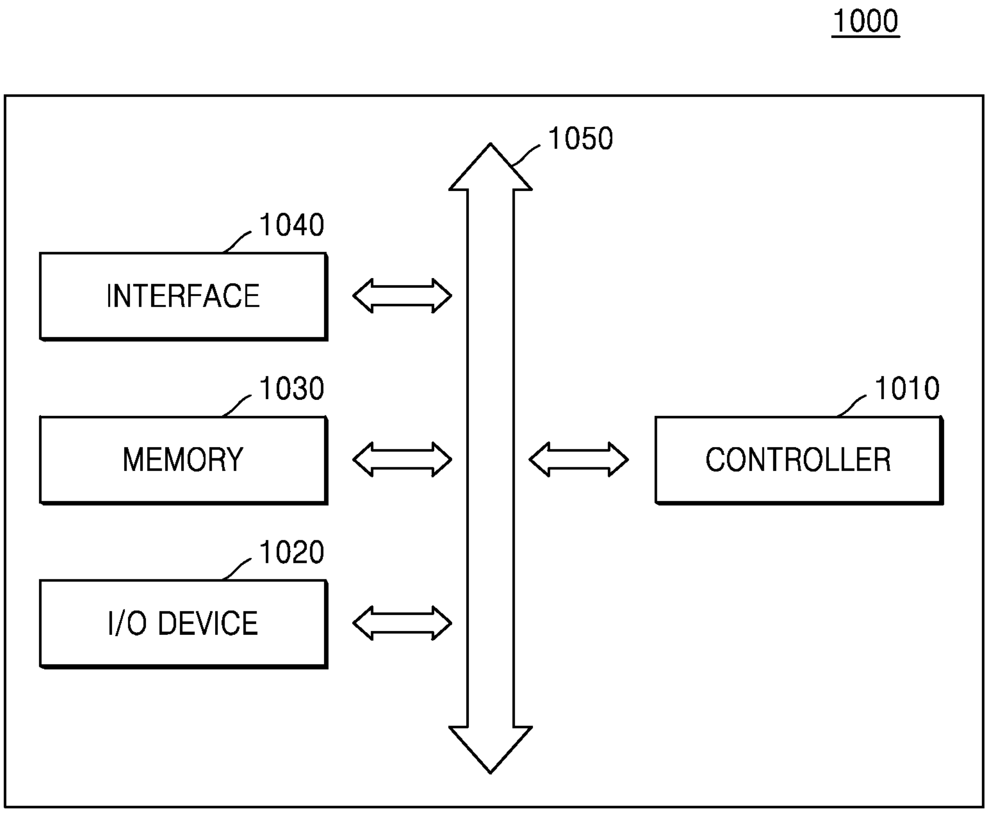
FIG. 4 is a schematic view illustrating an electronic system including a memory card according to an embodiment.

FIG. 4 is a schematic view illustrating an electronic system 1000 including a memory card according to an embodiment. More specifically, the electronic system 1000 may include a controller 1010, an input/output (I/O) device 1020, a memory 1030, and an interface 1040. The electronic system 1000 may be a mobile system or a system for transmitting or receiving information. The mobile system may be a personal digital assistant (PDA), a portable computer, a web tablet, a wireless phone, a mobile phone, a digital music player, or a memory card.

The controller 1010 may be configured to execute and controls a program. The controller 1010 may include a semiconductor device. The controller 1010 may be, for example, a micro-processor, a digital signal processor (DSP), a micro controller, or other similar devices.

The I/O device 1020 may be configured to input or output data of the electronic system 1000. The electronic system 1000 may be connected to an external device, for example, a personal computer (PC) or a network, by using the I/O device 1020 to exchange data with the external device. The I/O device 1020 may be, for example, a keypad, a keyboard, or a display.

The memory 1030 may be configured to store codes and/or data for operations of the controller 1010 and/or data processed by the controller 1010. The memory 1030 may include a semiconductor device. The memory 1030 may include a main memory unit and an auxiliary memory unit, and the auxiliary memory unit may include a memory card having a first alignment structure formed therein and a memory card socket having a second alignment structure formed therein.

The interface 1040 may be a data transmission path between the electronic system 1000 and an external device. The controller 1010, the I/O device 1020, the memory 1030, and the interface 1040 may be configured to communicate with each other through a bus 1050.

For example, the electronic system 1000 may be used for a mobile phone, an MP3 player, a navigation system, a portable multimedia player (PMP), a solid state disk (SSD), household appliances, or a memory card.

Figure 5:
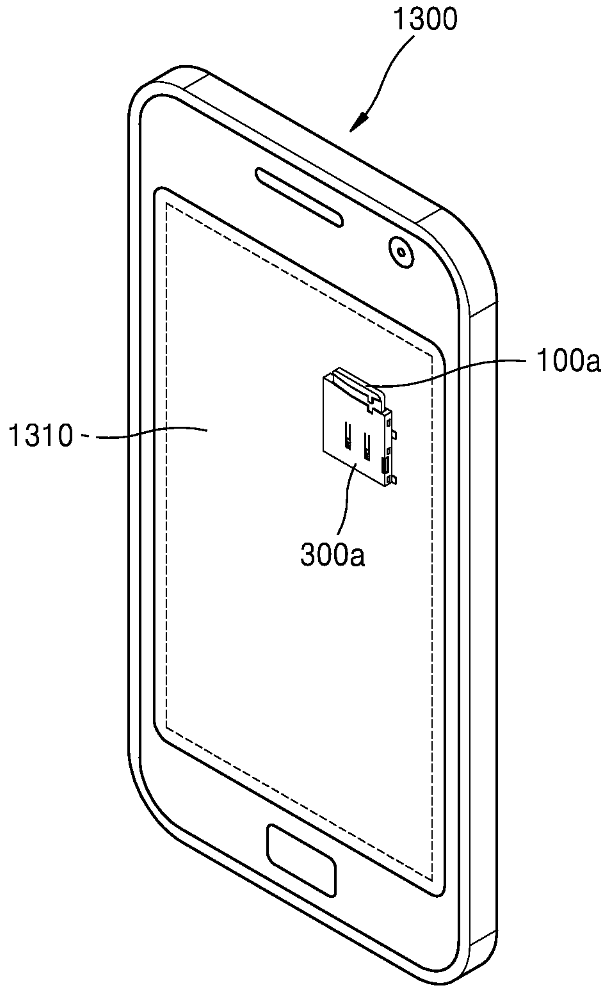
FIG. 5 is a perspective view schematically illustrating an electronic device including a memory card and a memory card socket according to an embodiment.

FIG. 5 is a perspective view schematically illustrating an electronic device 1300 including the memory card 100*a* and the memory card socket 300*a* according to an embodiment.

The electronic device 1300 collectively refers to a device electrically connected with an external memory card and configured to transmit information such as pictures, voice, video, or data to the external memory card 100*a* or to receive the information from the memory card 100*a*. For example, the electronic device 1300 may be a computer, a digital camera, a digital camcorder, a mobile phone, a personal portable information terminal, or the like. The electronic device 1300 may include a main board 1310 and the memory card socket 300*a*. The memory card socket 300*a* may be formed on an outer surface of the main board 1310 so as to be directly exposed to outside. In the memory card socket 300*a*, the memory card insertion hole may be opened and closed by a cover formed on the main board 1310. The memory card socket 300*a* may have a receiving space for receiving the memory card 100*a* therein. For example, the receiving space may be formed to have a volume that allows the whole area of the memory card 100*a* to be inserted.

The memory card socket 300*a* may include multiple contacts that may be configured to be electrically connected with the external connection terminals of the memory card 100*a*. The number, size, or arrangement of contacts and the number, size, or arrangement of external connection terminals are provided to facilitate electric connection.

More specifically, a detailed example of application of the electronic system 1000 of FIG. 4 to the electronic device 1300 is illustrated. The electronic device 1300 may include the memory card 100*a* and the memory card socket 300*a* on the main board 1310. The memory card 100*a* may be inserted into the memory card socket 300*a* and may be mounted on the main board 1310. The memory card 100*a* may have a high-capacity memory while having a small area, thereby minimizing the size of the electronic device 1300 and allowing storage of a large amount of data.

An embodiment includes a memory card, in which it is possible to prevent the memory card from being inserted into a memory card socket in a reverse direction.

An embodiment includes an electronic device, in which it is possible to prevent the memory card from being inserted into a memory card socket in a reverse direction.

An embodiment includes a memory card having two main top surface and bottom surface that face each other, the memory card including an external connection terminal formed on the bottom surface and a first alignment structure formed on the top surface or the bottom surface to prevent reverse-direction insertion of the memory card.

The memory card may further include a grip portion on a main surface on which the first alignment structure is formed, in which the first alignment structure is formed to contact the grip portion.

The memory card may further include a grip portion on a main surface on which the first alignment structure is formed, in which the first alignment structure is formed to be spaced apart from the grip portion.

A plurality of first alignment structures may be provided and have different shapes.

A length from a front end portion of the first alignment structure to a rear end portion of the memory card along a memory card insertion direction may be longer than a length from a front end portion of the memory card to a rear end portion of the external connection terminal.

The memory card may further include a stopper groove in a side surface of the memory card in parallel with the memory card insertion direction.

When the memory card is inserted into a memory card socket including a second alignment structure and a stopper protrusion, the first alignment structure may be received in the second alignment structure.

A number of first alignment structures may be equal to a number of second alignment structures.

A size of the second alignment structure may be larger than a size of the first alignment structure.

The first alignment structure and the second alignment structure may have shapes that are complementary to each other.

When the first alignment structure is received in the second alignment structure, the stopper protrusion may be stopped by the stopper groove.

An embodiment includes an electronic device including a controller, an input/output (I/O) device capable of inputting or outputting data, a memory capable of storing data, an interface capable of transmitting data to an external device, and a bus connecting the controller, the I/O unit, the memory, and the interface to communicate with each other, in which the memory may include a main memory and an auxiliary memory, and the auxiliary memory may include a memory card having a first alignment structure formed therein and a memory card socket having a second alignment structure formed therein.

The first alignment structure may be removably coupled to the second alignment structure.

The memory card may further include a stopper groove and an external connection terminal.

A length of the second alignment structure may be longer than from a front end portion of the memory card to a rear end portion of the external connection terminal along the memory card insertion direction.

Regardless of the particular application, any memory card in the electronic system 1000, electronic device 1300, or the like may be configured according to an embodiment similar to those described herein. Moreover, such an application may include a corresponding memory card socket according to an embodiment similar to those described herein.

While embodiments have been particularly shown and described with reference to the drawings, it will be understood that various changes in form and details may be made therein without departing from the spirit and scope defined by the following claims.

What is claimed is:

1. A memory card, comprising:
- a top surface;
- a bottom surface on an opposite side of the memory card from the top surface;
- a first alignment structure formed on the top surface or the bottom surface and configured to interface with a corresponding second alignment structure of a memory card socket when the memory card is correctly inserted into the memory card socket and configured to substantially prevent full insertion of the memory card when the memory card is incorrectly inserted into the memory card socket; and
- a grip portion on the top surface or the bottom surface on which the first alignment structure is formed,
- wherein the first alignment structure is an engraved shape in the grip portion.

2. The memory card of claim 1, wherein the first alignment structure is one of a plurality of first alignment structures.

3. The memory card of claim 2, wherein at least one of the first alignment structures has a shape different from a shape of another one of the first alignment structures.

4. The memory card of claim 1, further comprising:
- an external connection terminal formed on the bottom surface;
- wherein a length from a front end portion of the first alignment structure to a rear end portion of the memory card along a memory card insertion direction is longer than a length from a front end portion of the memory card to a rear end portion of the external connection terminal.

5. The memory card of claim 1, further comprising a stopper groove disposed in a side surface of the memory card in parallel with a memory card insertion direction.

6. A system, comprising:
- a memory card comprising:
  - a top surface;
  - a bottom surface on an opposite side of the memory card from the top surface;
- a first alignment structure formed on the top surface or the bottom surface;
- a grip portion on the top surface or the bottom surface on which the first alignment structure is formed,
  - wherein the first alignment structure is an engraved shape in the grip portion; and
- a memory card socket comprising a second alignment structure configured to interface with the first alignment structure when the memory card is correctly inserted into the memory card socket and configured to substantially prevent full insertion of the memory card when the memory card is incorrectly inserted into the memory card socket.

7. The system card of claim 6, wherein:
- the first alignment structure is one of a plurality of first alignment structures;
- the second alignment structure is one of a plurality of second alignment structures; and a number of the first alignment structures is equal to a number of the second alignment structures.

8. The system card of claim 6, wherein:

the first alignment structure is one of a plurality of first alignment structures;

a first one of the first alignment structures is disposed on the top surface of the memory card; and a second one of the first alignment structures is disposed on the bottom surface of the memory card.

9. The system of claim 6, wherein the first alignment structure and the second alignment structure have shapes that are complementary to each other.

10. The system of claim 6, wherein:

the memory card further comprises a stopper groove;

the memory card socket further comprises a stopper protrusion; and when the first alignment structure is received in the second alignment structure, the stopper protrusion engages with the stopper groove.

11. An electronic device comprising:

a controller; and a memory coupled to the controller and configured to store data;

wherein the memory comprises:

a memory card having a first alignment structure formed on a top surface or a bottom surface of the memory card and a grip portion on the top surface or the bottom surface on which the first alignment structure is formed, wherein the first alignment structure is an engraved shape in the grip portion; and a memory card socket having a second alignment structure configured to interface with the first alignment structure of the memory card when the memory card is inserted in the memory card socket.

12. The electronic device of claim 11, wherein the first alignment structure is removably coupled to the second alignment structure.

13. The electronic device of claim 11, wherein the memory card further comprises a stopper groove and an external connection terminal.

14. The electronic device of claim 13, wherein the memory card comprises an external connection terminal configured to electrically connect with a contact of the memory card socket;

a length from a front end portion of the first alignment structure to a rear end portion of the memory card along a memory card insertion direction is longer than a length from a front end portion of the memory card to a rear end portion of the external connection terminal.

* * * * *